MOUNTING CHASSIS FOR ELECTRICAL COMPONENTS

Filed Oct. 20, 1966 3 Sheets-Sheet 1

INVENTOR.
ERNEST R. BLAIKIE
BY
William [signature]
ATTY.

INVENTOR.
ERNEST R. BLAIKIE
BY
William L. Reeve
ATTY.

INVENTOR.
ERNEST R. BLAIKIE
BY
ATTY.

United States Patent Office 3,356,902
Patented Dec. 5, 1967

3,356,902
MOUNTING CHASSIS FOR ELECTRICAL COMPONENTS

Ernest R. Blaikie, Northfield Center, Ohio, assignor to Lear Siegler Inc., Santa Monica, Calif., a corporation of Delaware Filed Oct. 20, 1966, Ser. No. 588,118
6 Claims. (Cl. 317—100)

ABSTRACT OF THE DISCLOSURE

A device for the mounting of electrical components and particularly a device of modular construction permitting and providing heat dissipation from the mounted components and selective electrical connections between mounted components and utilizing structural elements of the device for thermal and electrical conduction. Although for simplicity of description the invention is hereinafter specifically disclosed as it pertains to its use in mounting the components of an electronic frequency changer, it will be apparent to those skilled in the art that the invention is also applicable to the mounting of any electrical components in any configuration where mounting, signal supply and heat dissipation are required.

In the ever-increasing use of circuits employing electronic components a need has developed for a standard apparatus for mounting this circuitry. This has become an especially pressing problem where economy of space and cost are dual considerations. Past attempts at solving this problem can be included in two general categories. The first approach was to develop the packaging on an "ad hoc" basis, with each circuit resulting in its own individual container. Although the results of such packaging may be satisfactory, the cost in time and money expended could be prohibitive. The other approach was just the opposite, and provided for a multipurpose mounting apparatus wherein considerations of size, appearance and functionality were subordinated to those of cost and utility. The design of this invention was arrived at with the shortcomings of these two prior approaches in mind.

The principal object of this invention is to provide an apparatus for mounting electronic components having a configuration suitable for use in numerous applications.

Another object of this invention is to provide an apparatus for mounting electronic components and having contained therein the means for protecting the components, supplying electrical signals to and between the components and dissipating any heat resulting from the components' operation.

A further object of this invention is to provide an apparatus for mounting electronic components wherein the mounting means, signal conducting means, heat dissipating means and component proctection means are combined in a unique manner to effect a reduction in size and weight of the apparatus, while improving mechanical strength and flexibility of use.

A still further object of this invention is to provide an apparatus for mounting electronic components wherein all circuit components and signal leads may be removed from the exterior surface of the unit to allow more effective use in an overall system, while improving the appearance of the unit.

A still further object of this invention is to provide an apparatus for mounting electronic components having a configuration suitable for mechanical and electrical mounting and interconnection of similar multiple modular units.

The invention further resides in certain novel features of the construction and in the combination and arrangement of the apparatus parts, and further objects and advantages of the invention will be apparent from the following description of a presently preferred embodiment described with reference to the accompanying drawings forming a part of this application in which.

*Structural description of basic chassis*

Figure 1:
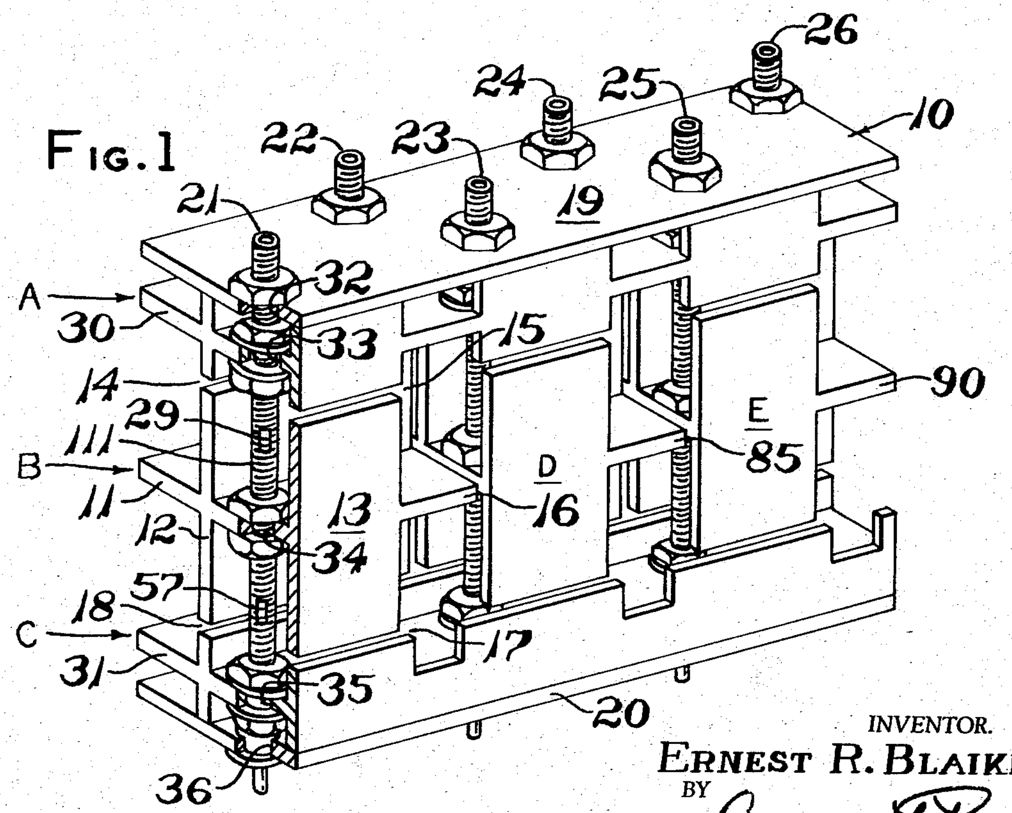
FIG. 1 is a perspective view of the chassis with a section cut away to illustrate the mounting details of a tube therein, the cooling fins not being shown for purposes of clarity of illustration.

The basic chassis which is the embodiment of this invention can assume as many particularized forms as the situation requires. The form chosen in FIG. 1 is particular to the static frequency converter circuit shown in FIG. 2. However, as the description will illustrate, the invention claimed is a basic configuration applicable to numerous electrical circuits, and not limited to the application shown.

The overall chassis 10 as shown in FIG. 1 is comprised of five integral units designated A–E. These units are formed by a network of rigidly affixed horizontal and vertical members. The units are joined together by the insertion through the horizontal members of rigid tubes arranged in a vertical array. Each unit is maintained electrically and thermally separate from the others by the insertion of dielectric material within the device. The manner of doing this and the resulting benefits are fully outlined below. However, it is apparent that this will allow the isolation of particular parts of a circuit mounted on this chassis from the entire circuit, and even facilitates the mounting of a number of functionally different circuits on the same device.

The physical appearance of the units A–E differ, with unit A and unit C being similar in appearance, and units B, D and E also being similar. However, regardless of dissimilarities in appearance, all units are basically alike in their construction and operate in the same manner. For this reason unit B will be chosen as typical and described in detail with the understanding that the description is also generally applicable to Units A, C, D and E, as illustrated in FIG. 1. With reference to FIG. 1, unit B consists of a horizontal member 11 rigidly affixed, by conventional means not shown, to vertical members 12 and 13. Members 11–13 are constructed of a material that is selected from those having good thermal and electrical conductivity. The members 11–13 of unit B are isolated from the rest of the chassis 10 by a dielectric medium comprising air gaps 14–18. These air gaps 14–18 serve to maintain the thermal and electrical integrity of unit B. It should be noted that if the chassis requires more rigidity and structural integrity for a particular application, suitable dielectric material may be placed in air gaps 14–18. The overall chassis 10 is electrically and thermally insulated from other devices by insulating covers 19 and 20. The dielectric material used in covers 19 and 20 may be chosen to perform the secondary function of adding structural strength to chassis 10. A further feature, not incorporated in the attached drawings, is the ability completely to enclose the device in a rigid dielectric material, similar to that of covers 19 and 20, to provide complete insulation of the device and the circuit mounted thereon.

Figure 5:
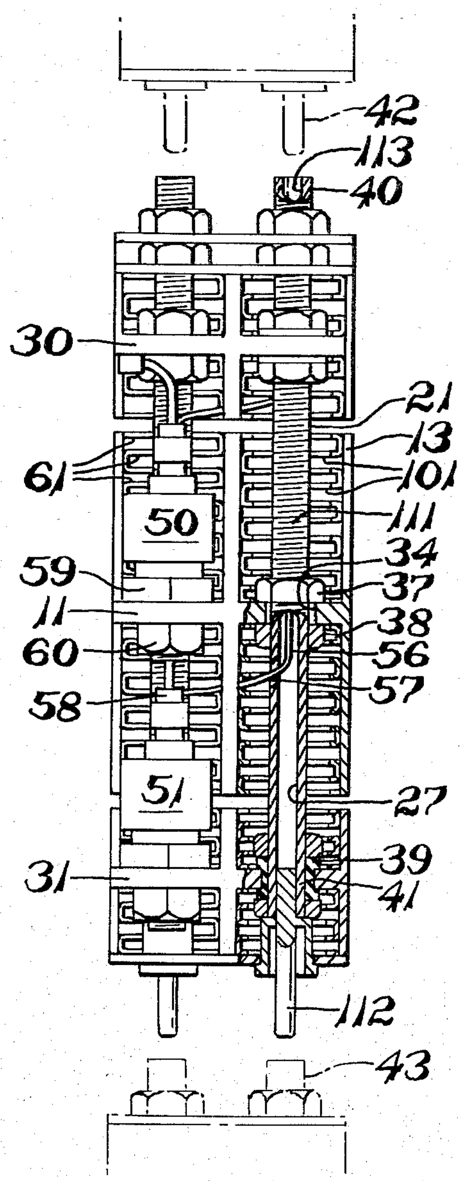
FIG. 5 is a side elevational view of the apparatus, partially in section, illustrating its capability of being joined with similar chassis.

A principal feature of this device is the construction of tubes 21–26 and their use in the chassis. Since the functions performed by these tubes and their manner of performing them are similar, discussion will be directed toward tube 21 with the understanding that the other tubes 22–26 function in a like manner. As best seen in FIGS. 1 and 5, tube 21 is a rigidly constructed cylindrical body of high electrical and thermal conductivity, such as copper or aluminum for example, and having formed within it and extending its entire length a passageway 27. Openings 57 and 29 are formed in the wall of tube 21, by which entrance is gained to passageway 27. Electrical connection to tube 21 and access to passageway 27 can also be accomplished through male plug 112 and female receptacle 113 mounted in opposite tube ends 411 and 40, respectively, of passageway 27. Tube 21 is vertically mounted within the overall chassis 10 and serves as a structural member thereof. Mounting is accomplished in the following manner. Tube 21 extends through dielectric cover 19, horizontal member 30 of unit A, horizontal member 11 of unit B, horizontal member 31 of unit C and dielectric cover 20 by means of circular openings 32–36 respectively. These openings 32–36 are of a larger diameter than tube 21 so that no contact is made by the tubes with the horizontal members at the openings. The outer surface of tube 21 is provided with threading 111 sufficient to accept lock nuts which rigidly affix the tube to the horizontal members associated with openings 32–36. In securing the tube 21 to the horizontal members, two distinct methods are employed. In the first instance, electrical and thermal contact is required between the tube and the horizontal member to which it is affixed. This is illustrated best by reference to FIG. 5. In this instance thermal and electrical conduction is desired between tube 21 and horizontal member 11 of unit B. Since tube 21 is of a smaller diameter than opening 34, no direct contact exists between the adjacent surfaces. Conduction is accomplished when lock nuts 37 and 38 are turned down to the surface of horizontal member 11. This interaction between surfaces of tube 21 and horizontal member 11 may also be aided by the insertion of a conductive grommet to fill the gap between tube 21 and horizontal member 11.

The second mounting requirement exists when it is desired to secure a tube to a horizontal chassis member with neither thermal nor electrical conduction occurring. This mounting mode is illustrated in FIG. 5. In order to secure tube 21 to horizontal member 31, a non-conductive grommet 39 is placed in the gap between tube 21 and member 31 with a grommet flange abutting the upper and lower surface of member 31, thereby isolating direct or indirect contact between the tube 21 and horizontal member 31. As illustrated in FIG. 5, the extremity 40 of tube 21 and the male plug 112, secured by means not shown to the other extremity 41 of tube 21, project beyond the overall chassis 10. Extremity 40 has formed therein a female socket 113 capable of receiving a male plug, such as that shown in phantom as plug 42 in FIG. 5, and establishing a mechanical and electrical connection between chassis 10 and any other chassis or associated equipment. Male plug 112 is intended to cooperate with a socket similar to female socket 113. As illustrated in FIG. 5, male plug 112 and female socket 113 also facilitate creation of a mechanical and electrical connection between the basic chassis 10 and associated equipment such as that shown in phantom in FIG. 5 and illustrated by male plug 42 and female receptacle 43. In this manner units can be interconnected and stacked, thus allowing maximum utilization of available space.

Figures 3, 4:
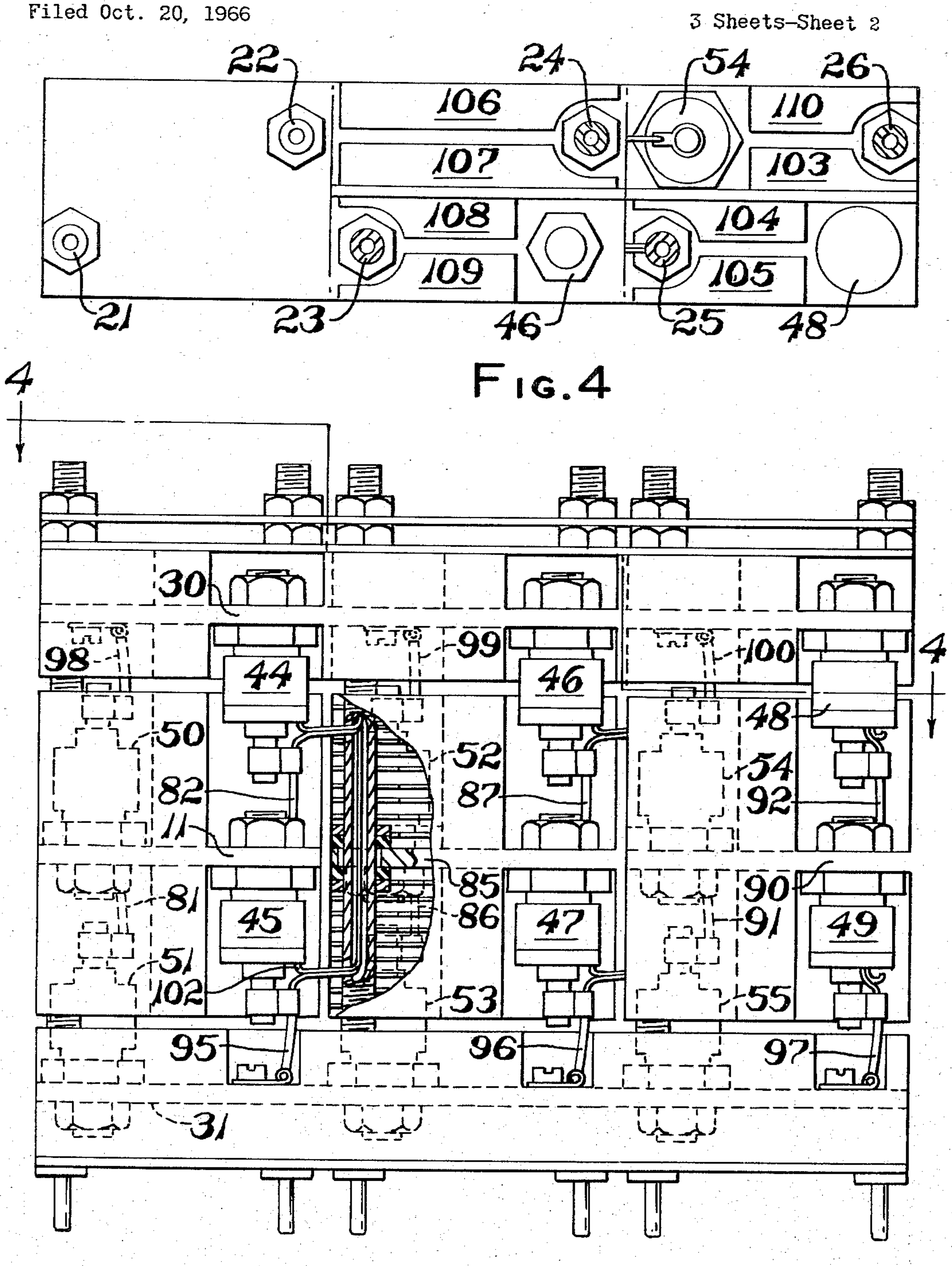
FIG. 3 is a front elevational view, partially in section, illustrating the complete chassis with the circuit of FIG. 2 mounted thereon.
FIG. 4 is a plan view of the apparatus shown partially in section along line 4—4 of FIG. 3.

Honeycombed heat dissipating fins are mounted within the overall chassis 10 to the horizontal members. Fin section 101 in unit B is a typical example. Referring to FIG. 5, it can be seen that fin section 101 is mounted on horizontal member 11 of unit B by suitable means not shown. Thermal conduction is maintained between horizontal member 11, vertical member 13 and section 101. This fin section 101 and all others within the chassis 10 are formed to envelop the tubes and mounted components without maintaining direct physical contact with these tubes or components. FIG. 4 is illustrative of the manner in which fin sections 103 and 110 are mounted in relation to the adjoining tubes and components.

The area available for mounting components on a particular horizontal member can be varied to accommodate the circuitry involved. Variations as to size, depth and numbers of the horizontal members, vertical members and tubes may be made without departing from the novel concept upon which this invention is based.

*Functional description of basic chassis*

This chassis performs a number of functions in a unique and versatile manner. The basic chassis 10 is used for mounting the electronic components which make up the particular circuit involved and is designed to mate with other similar chassis wherein may be mounted associated equipment. It provides for the supply of signal inputs and outputs to these components without the use of extraneous and unsightly wiring, while providing protection for the components and that wiring which may be found necessary. The dissipation of any heat generated by the electronic components is another benefit realized through the use of this invention. In the past these functions were treated as separate entities, sometimes provided by the mounting chassis and other times by external means. This invention provides for the combination of these functions within the chassis enabling their performance in a unique and economical fashion as relates to cost and space.

In a typical chassis 10, as shown in FIG. 1, mounting of components is accomplished by affixing them to horizontal members of the chassis called shelves. The type of component will determine the particular method of mounting. The Silicon Controlled Rectifiers (SCR's) 44–55 in FIG. 3 are designed for securing to a surface with a nut which engages threads on the surface of the body of the rectifier. Once mounted to the chassis shelf, the component is protected by a shell defined by the horizontal and vertical members of chassis 10, as illustrated by horizontal member 11 and vertical members 12 and 13.

The passage of electrical signals to and from the mounted components is accomplished by the tubes 21–26. These tubes can be used either as conduits for wiring or as actual conductors. When used as conduits, wire conductors are passed through the internal passageway and exit through the opening in the wall, using the tube and opening most convenient to the electronic component requiring the conductor. An application of this can be seen in FIG. 5. SCR51, which is mounted on horizontal member 31 of unit C, is electrically connected to conductor 56 at trigger input contact 58. Conductor 56 enters tube 21 through opening 57 and is routed through passageway 27 to the point of origin of the required signal. In the other application of signal conduction the tubes are used as the actual conductor. How this may be accomplished can be seen by reference to FIG. 5. A power signal is impressed on the anode 59 of SCR50 by the action of tube 21 and horizontal member 11. The input power is applied to tube 21 at male plug 112. It is transmitted by the walls of tube 21 to horizontal member 11, contact being made between tube 21 and horizontal member 11 by lock nuts 37 and 38. It should be noted that this particular signal is isolated from all other horizontal members by the action of insulating grommets placed between the horizontal members 30 and 31 and the tube 21. Thus, we see that input and output signals to the components can be transmitted by the tubes 21–26 acting as either conduits or conductors. In the particular embodiment illustrated by FIGS. 2–5, each tube is used to supply only one integral unit of the chassis, however, if required, the tube can supply more than one chassis unit.

A further advantage gained by the novel combination of the tubes and structural members of the chassis is heat dissipation. Since the body of the component as exemplified by SCR50 is mounted in direct thermal contact with horizontal member 11 by lock nut 60, any heat generated by SCR50 would be conducted through member 11 to members 12 and 13 and tube 21. To aid in dissipating this heat a honeycombed dissipator 61, comprising fins in thermal contact with the horizontal and vertical members of the chassis, is included. These honeycombed heat dissipating fins are inserted as required by the circuit being mounted. They are in thermal contact with the horizontal and vertical chassis unit members to dissipate the conducted heat. Where the circuit involved does not generate appreciable amounts of heat, the fins may be omitted.

*Typical circuit description*

Figure 2:
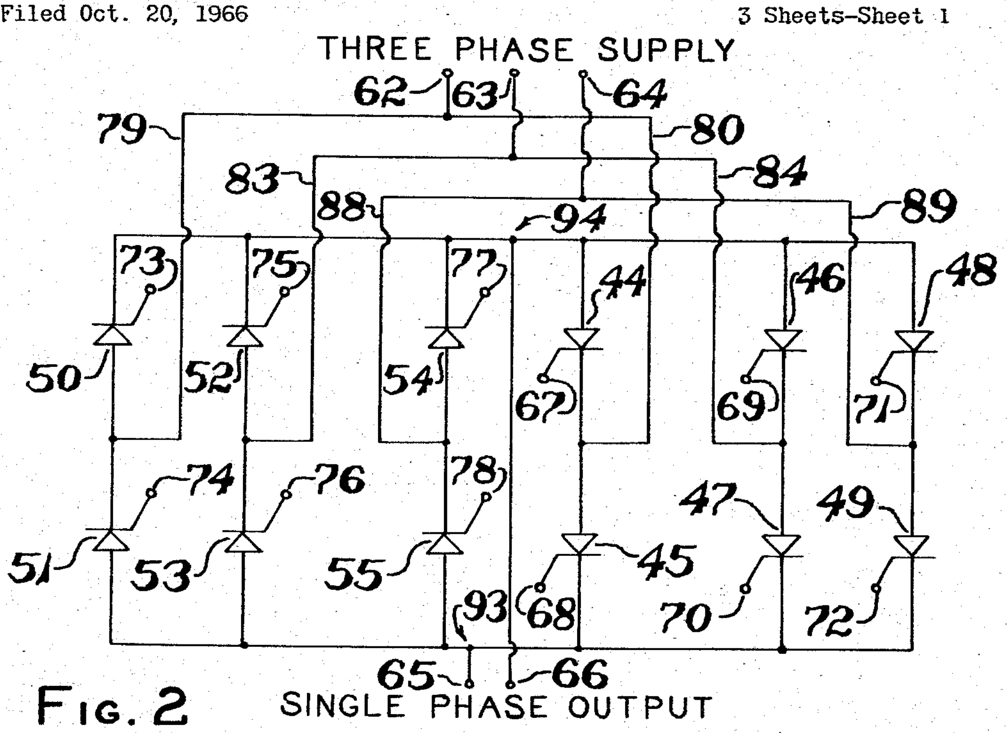
FIG. 2 is a circuit diagram of two full wave bridges which serves to illustrate a typical application for the chassis.

A typical circuit for mounting on the overall chassis 10 is illustrated by FIG. 2 wherein is configured the SCR's and circuit wiring used in a static frequency converter. A brief description of this circuit will allow a better understanding of the input and output signals required for its operation and the facility with which this invention supplies them.

The circuit of FIG. 2 comprises 12 SCR's arranged to form two full-wave three phase bridges. One bridge is used to provide positive current flow, the other negative current flow. The SCR's are normally in a non-conducting state. Breakdown of this non-conducting state is achieved by applying a control signal to the gate of the individual rectifier. This signal can be and usually is a current pulse of small amplitude and is used both to turn on and turn off the particular SCR. The input circuit is a three-phase alternating current source which, when operated upon by the positive and negative bridges, results in a single-phase output. Both the input and output currents of the frequency converter can be of large amplitudes. The control current used to trigger the SCR's is supplied by a firing module, not shown, the details of which are not required to explain its use in this invention.

*Mounting of typical circuit on basic chassis*

In the previous description of the circuit of FIG. 2 it was noted that the 3-phase supply current inputs 62–64 and the single-phase current outputs 65–66 are usually of a large magnitude. Also as described, the control signal inputs 67–78 applied to trigger SCR's 44–55, respectively, are of a relatively small magnitude. For these reasons, as more fully described hereinafter, the control signals will be transmitted by wire conductors using the tubes 21–26 as their conduits, and the input and output signals will be conducted by the tubes 21–26 themselves acting as conductors.

To facilitate explanation of the mounting of the frequency changer on the basic chassis, it is necessary to correlate the circuitry of FIG. 2 with its corresponding elements on the basic chassis 10. This correlation will be integrated into the description which follows.

The circuit of the frequency changer has as a requirement a three phase input 62–64. One phase 62 is supplied by two branches 79 and 80, branch 79 supplying the junction formed by the cathode of SCR51 and the anode of SCR50, the other branch 80 supplying the junction of the cathode of SCR44 and the anode of SCR45. On the basic chassis 10 input phase 62 is externally produced and supplied to the chassis by tube 21. Tube 21 impresses this input phase 62 on horizontal member 11 of unit B by the method previously described. The anodes of SCR50 and SCR45 are directly mounted on horizontal member 11 while the cathodes of SCR51 and SCR44 are connected thereto by means of jumpers 81 and 82 respectively. Input phase 63 is supplied by two branches 83 and 84, branch 83 supplying the junction formed by the cathode of SCR53 and the anode of SCR52, and other branch 84 supplying the junction of the cathode of SCR46 and the anode of SCR47. On the basic chassis 10 input phase 63 is externally produced and supplied to the chassis by tube 23. Tube 23 impresses this input phase 63 on horizontal member 85 of unit D by the method previously described. The anodes of SCR47 and SCR52 are directly mounted on horizontal member 85 while the cathodes of SCR53 and SCR46 are connected thereto by means of jumpers 86 and 87 respectively. Input phase 64 is supplied by two branches 88 and 89, branch 88 supplying the junction formed by the cathode of SCR55 and the anode of SCR54, the other branch 89 supplying the junction formed by the cathode of SCR48 and the anode of SCR49. On the basic chassis 10 input phase 64 is externally produced and supplied to the chassis by tube 25. Tube 25 impresses this input phase 64 on horizontal member 90 of unit E. The anodes of SCR54 and SCR49 are directly mounted on horizontal member 90 while the cathodes of SCR55 and SCR48 are connected thereto by means of jumpers 91 and 92 respectively. Node 93 which is formed at the anodes of SCR51, 53, 55 and the cathodes of SCR45, 47, 49 terminates in the single phase output 65. On the basic chassis 10 this circuit is duplicated by the combination of horizontal members 31 of unit C and tube 24. Contact between tube 24 and horizontal member 31 is accomplished in the previously described manner. The anodes of SCR's 51, 53 and 55 are directly mounted on member 31 whereas the cathodes of SCR's 45, 47 and 49 are connected by jumpers 95–97 respectively. Node 94 which is formed at the anodes of SCR's 44, 46 and 48 and the cathodes of SCR's 50, 52 and 54 terminates in the single phase output 66. On the basic chassis 10 this circuit is duplicated by the combination of the horizontal member 30 of unit A and tube 22. Contact between tube 22 and horizontal member 30 is accomplished as previously stated. The anodes of SCR's 44, 46 and 48 are directly mounted on member 30 whereas the cathodes of SCR's 50, 52 and 54 are connected by jumpers 98–100 respectively. The gate inputs to trigger SCR's 44–45 are designated 67–68 respectively. These trigger inputs are generated by firing logic modules, not shown, which establish the firing sequence of the SCR's. The firing modules may be mounted on the basic chassis 10, either directly above the dielectric cover 19 or by inserting another horizontal member below cover 19 and securing it to tubes 21–26, to form a mounting shelf. Whichever method of mounting the firing modules is chosen the trigger signal is carried to the particular SCR by conductors running through the passageways of tubes 21–26. One example of this is illustrated at FIG. 3 where conductor 102 using tube 23 as a conduit carries the trigger signal to the cathode of SCR45. This illustrates only one particular configuration of the invention which is adapted for use with a frequency changer. It should be noted that in this embodiment of the invention the trigger signals to the SCR's being of smaller magnitude were transmitted using the tubes 21–26 as conduits. The input and output signals being of a larger magnitude were transmitted using the tubes 21–26 as conductors. This is the preferred usage for the presently preferred embodiment but isn't a limitation which need be imposed on other embodiments. It should be apparent to those skilled in the art that tubes 21–26 are designed for concurrent use as both electrical conduits and conductors as well as heat dissipators.

I claim:

1. An apparatus for mounting electrical components comprising electrically conductive component receiving means, electrically conductive structural spacing means, electrically conductive connecting means for connecting said spacing means to and between selected ones of said component receiving means, and electrically nonconductive connecting means for connecting said spacing means to and between others of said component receiving means, whereby said component receiving means are maintained in spaced relationship and formed together in an integral structural unit with selected ones of said component receiving means electrically interconnected through said spacing means and others of said component receiving means electrically insulated from each other and from said spacing means.

2. An apparatus for mounting electrical components comprising electrically and thermally conductive component receiving means, electrically and thermally conductive structural spacing means, and electrically and thermally conductive connecting means connecting said spacing means to and between selected ones of said component receiving means, electrically non-conductive connecting means for connecting said spacing means to and between others of said component receiving means, and heat dissipating means mounted on and in thermal contact with said component receiving members whereby said component receiving means are maintained in spaced relationship and formed together in an integral heat dissipating and electrical component mounting structural unit with selected ones of said component receiving means electrically interconnected through said spacing means and others of said component receiving means electrically insulated from each other and from said spacing means.

3. An apparatus for mounting electrical components according to claim 2, each of said spacing means comprising a conduit having a rigid circular wall, an axial passageway formed by said wall, radial passageways formed in said wall and extending between said axial passageway and the exterior of said conduit for permitting insulated electrical conductors to enter and leave and use and extend along preselected portions of said axial passageway.

4. An apparatus for mounting electrical components according to claim 2, said spacing means having two end portions, one end portion comprising a male plug and the other end portion comprising a female socket, whereby said apparatus may be electrically and mechanically joined to similar apparatus.

5. An apparatus according to claim 2 in which at least one of said connecting means further comprises an electrically non-conducting grommet having a tubular body having a flange at either end thereof passing through one of said receiving members and surrounding said connected spacing means and electrically insulating said connected spacing means and said component receiving means from each other at the connection therebetween comprising said grommet.

6. An apparatus for mounting electrical components comprising electrically and thermally conductive component receiving means of generally right angular cross section; electrically and thermally conductive longitudinally extending conduits mounted on and in angular relationship with portions of said receiving means, said conduits comprising a circular wall, an axial passageway formed by said wall extending the length of said conduits, a radial passageway formed in said wall whereby entrance and egress to said axial passageway is provided; a male plug on one end of said conduits and a female socket on the other end of said conduits; connecting means for connecting selected points along the lengths of said conduits to selected ones of said component receiving means; grommets spacing said conduits and said connecting means at selected connections therebetween, said grommets comprising electrically non-conductive material, dielectric means separating certain portions of said component receiving means, heat dissipating means in direct thermal contact with said component receiving means.

References Cited

UNITED STATES PATENTS

| | | | |
|---|---|---|---|
| 3,148,356 | 9/1964 | Hedden | 340—174 |
| 3,226,602 | 12/1965 | Elfving | 317—100 |
| 3,277,346 | 10/1966 | McAdam et al. | 317—100 |
| 3,246,213 | 4/1966 | Hannan. | |

ROBERT K. SCHAEFER, *Primary Examiner.*

M. GINSBURG, *Assistant Examiner.*